United States Patent
So et al.

(10) Patent No.: US 9,202,823 B2
(45) Date of Patent: Dec. 1, 2015

(54) THIN FILM TRANSISTOR ARRAY PANEL AND MANUFACTURING METHOD THEREOF

(71) Applicant: SAMSUNG DISPLAY CO., LTD., Yongin, Gyeonggi-Do (KR)

(72) Inventors: Byung Soo So, Yongin-si (KR); Jong Hyun Choi, Seoul (KR); Shin Moon Kang, Seoul (KR); IL Hun Seo, Suwon-si Gyeonggi-do (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/479,557

(22) Filed: Sep. 8, 2014

(65) Prior Publication Data
US 2015/0102350 A1    Apr. 16, 2015

(30) Foreign Application Priority Data
Oct. 15, 2013    (KR) .................. 10-2013-0122826

(51) Int. Cl.
*H01L 27/12*    (2006.01)
(52) U.S. Cl.
CPC ........ *H01L 27/1237* (2013.01); *H01L 27/1255* (2013.01); *H01L 27/1274* (2013.01)
(58) Field of Classification Search
CPC ............ H01L 27/1237; H01L 27/1274; H01L 27/1222; H01L 27/1255
See application file for complete search history.

(56) References Cited

U.S. PATENT DOCUMENTS

2006/0081946 A1*  4/2006  Yanai et al. ................. 257/392
2007/0046178 A1*  3/2007  Imai et al. ................... 313/504

FOREIGN PATENT DOCUMENTS

| KR | 10-2009-0126452 A | 12/2009 |
|---|---|---|
| KR | 10-2009-0127687 A | 12/2009 |
| KR | 10-1151287 B1 | 5/2012 |

* cited by examiner

*Primary Examiner* — Roy Potter
*Assistant Examiner* — Paul Patton
(74) *Attorney, Agent, or Firm* — Lee & Morse, P.C.

(57) ABSTRACT

A thin film transistor array panel includes a plurality of pixels on a substrate. Each pixel of the plurality of pixels includes a driving and a switching thin film transistor. The driving thin film transistor includes a first semiconductor including first source and drain regions, a first gate electrode overlapping the first semiconductor, a gate insulating layer between the first semiconductor and the first gate electrode, an oxide layer between the first semiconductor and the gate insulating layer, and first source and drain electrodes. The switching thin film transistor includes a second semiconductor including second source and drain regions, a second gate electrode overlapping the second semiconductor, and second source and drain electrodes. The switching thin film transistor includes the gate insulating layer between the second semiconductor and the second gate electrode. The gate insulating layer contacts an upper portion of the second semiconductor.

19 Claims, 17 Drawing Sheets

THIN FILM TRANSISTOR ARRAY PANEL AND MANUFACTURING METHOD THEREOF

CROSS-REFERENCE TO RELATED APPLICATION

Korean Patent Application No. 10-2013-0122826, filed on Oct. 15, 2013, in the Korean Intellectual Property Office, and entitled: "Thin Film Transistor Array Panel And Manufacturing Method Thereof," is incorporated by reference herein in its entirety.

BACKGROUND

1. Field

Embodiments relate to a thin film transistor array panel and a manufacturing method thereof.

2. Description of the Related Art

An organic light emitting diode (OLED) display is a kind of flat panel display (FPD) that may include a light emitting layer between two electrodes, one for injecting electrons and the other for injecting holes to the light emitting layer. The injected electrons and holes may be coupled at the light emitting layer, and excitons may thereby be formed. The formed excitons emit light while discharging energy. The (OLED) display advantageously is thin, has a wide viewing angle, and has a fast response speed. According to the driving method employed, an OLED display may be classified as a passive matrix OLED (PMOLED) display or as an active matrix OLED (AMOLED). In an active OLED display, an electrode and emission layer may be on a thin film transistor array panel, and the thin film transistor array panel may include signal lines and switching thin film transistors connected to the signal lines for controlling data voltages. The panel may further include driving thin film transistors that flow current to a light-emitting device by applying transmitted data voltages as gate voltages.

SUMMARY

Embodiments are directed to a thin film transistor array panel that includes a substrate and a plurality of pixels on the substrate. Each pixel of the plurality of pixels includes a driving thin film transistor and a switching thin film transistor. The driving thin film transistor includes a first semiconductor including a first source region and a first drain region, a first gate electrode overlapping the first semiconductor, a gate insulating layer between the first semiconductor and the first gate electrode, an oxide layer between the first semiconductor and the gate insulating layer, a first source electrode, a first drain electrode. The switching thin film transistor includes a second semiconductor including a second source region and a second drain region, a second gate electrode overlapping the second semiconductor, a second source electrode, and a second drain electrode. The switching thin film transistor may also include the gate insulating layer between the second semiconductor and the second gate electrode. The gate insulating layer may further contact an upper portion of the second semiconductor.

The oxide layer may have a thickness of about 50 Å to about 400 Å. The oxide layer may be a multilayer including a nitride layer and/or an oxynitride layer. The switching thin film transistor may be free of an oxide layer between the second semiconductor and the gate insulating layer. The driving thin film transistor may have a larger S-factor than an S-factor of the switching thin film transistor. The pixel may further include a storage capacitor including a first electrode and a second electrode overlapping each other, the gate insulating layer being between the first electrode and the second electrode.

A method of manufacturing a thin film transistor array panel is provided that includes the following. An amorphous silicon layer is formed on a substrate. The amorphous silicon layer is crystallized to form a polysilicon layer. An oxide layer is formed on the polysilicon layer. The polysilicon layer and the oxide layer are patterned to form a first semiconductor with the oxide layer thereon and a second semiconductor with the oxide layer thereon. The oxide layer on the second semiconductor is removed and the oxide layer is retained on the first semiconductor. A gate insulating layer is formed on the second semiconductor and the oxide layer on the first semiconductor. Gate electrodes are formed on the gate insulating layer, the gate electrodes respectively overlapping the first semiconductor and the second semiconductor.

The oxide layer may have a thickness of about 50 Å to about 400 Å. The formation of the oxide layer may include depositing $SiO_x$. The crystallization may include thermally crystallizing the amorphous silicon layer and controlling an oxygen atmosphere to generate a thermal oxide layer as part of the oxide layer. The formation of the first and second semiconductors and the removal of the oxide layer may be performed by photolithography processes and etching processes using one mask. A plasma treatment may be performed before forming the gate insulating layer. The plasma treatment may be performed by using $H_2$, $O_2$, $N_2O$, $N_2$, or a mixed gas including at least one of $H_2$, $O_2$, $N_2O$, and $N_2$. The patterning may include Banning a third semiconductor as a first electrode of a storage capacitor. The formation of the gate electrodes may include forming a second electrode of the storage capacitor overlapping the third semiconductor of the first electrode, the gate insulating layer being between the first electrode and the second electrode. The first semiconductor, the second semiconductor, and the third semiconductor with an impurity may be doped to form a source region and a drain region of the first thin film transistor, a source region and a drain region of the second thin film transistor, and the first electrode of the storage capacitor, respectively. The formation of the polysilicon layer may be performed after forming the oxide layer.

A method of manufacturing a thin film transistor array panel is provided that includes the following. An amorphous silicon layer is formed on a substrate. The amorphous silicon layer is crystallized to form a polysilicon layer. The polysilicon layer is patterned to form a first semiconductor and a second semiconductor. An oxide layer is formed on the first semiconductor and the second semiconductor. The oxide layer is patterned to remove the oxide layer except for the oxide layer on the first semiconductor. A gate insulating layer is formed on the second semiconductor and the oxide layer is formed on the first semiconductor. Gate electrodes are formed on the gate insulating layer, the gate electrodes respectively overlapping the first semiconductor and the second semiconductor.

A plasma treatment may be performed before forming the gate insulating layer. Patterning the polysilicon layer may include forming a third semiconductor for a first electrode of a storage capacitor. The formation of the gate electrodes may include forming a second electrode of the storage capacitor overlapping the third semiconductor, the gate insulating layer being between the first electrode and the second electrode. The first semiconductor, the second semiconductor, and the third semiconductor may be doped with an impurity to form a source region and a drain region of the first thin film transistor, a source region and a drain region of the second thin film transistor, and the first electrode of the storage capacitor, respectively.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
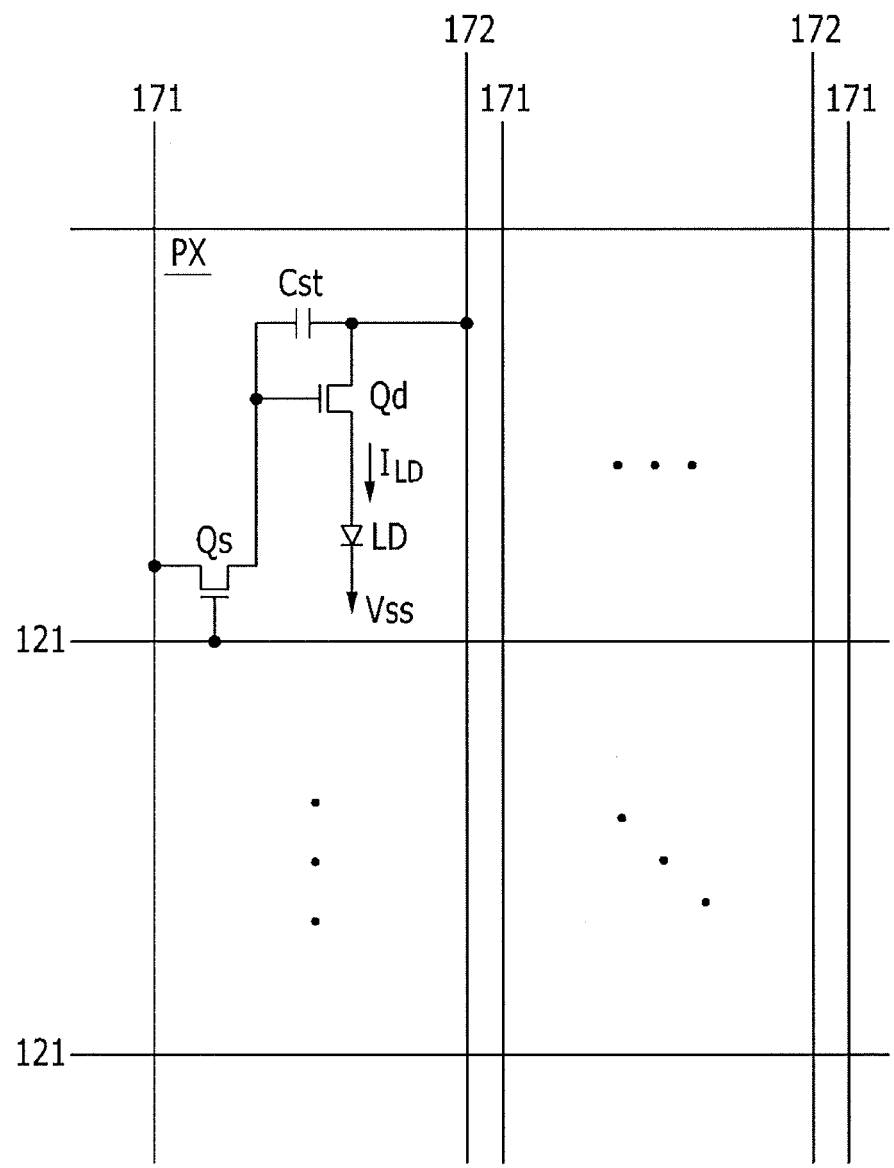
FIG. 1 illustrates a circuit diagram of an organic light emitting diode display including a thin film transistor array panel.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawings, the thickness of layers, films, panels, regions, and the like may be exaggerated for clarity. Like reference numerals designate like elements throughout the specification. When an element such as a layer, film, region, or substrate is referred to as being "on" another element, it can be directly on the other element or intervening elements may also be present. When an element is referred to as being "directly on" another element, there are no intervening elements present.

FIG. 1 illustrates a circuit diagram of an organic light emitting diode display including a thin film transistor array panel. Referring to FIG. 1, an organic light emitting diode display may include a plurality of signal lines 121, 171, and 712 and a plurality of pixels PX arranged approximately in a matrix form. The signal lines may include a plurality of scanning signal lines 121 that transmits scanning signals (or gate signals), a plurality of data lines 171 that transmits data signals, and a plurality of third signal lines 172 that transmits a driving voltage. The scanning signal lines 121 may extend substantially in a row direction and substantially parallel to each other, and the data lines 171 and the driving voltage lines 172 may extend substantially in a column direction and substantially parallel to each other.

Each pixel PX may include a switching thin film transistor Qs, a driving thin film transistor Qd, a storage capacitor Cst, and a light-emitting diode element LD as an organic light emitting diode. Among them, the switching thin film transistor Qs, the driving thin film transistor Qd, and the storage capacitor Cst may be formed as a thin film transistor array panel. A pixel PX may further include a thin film transistor and a capacitor to compensate a current provided to the light-emitting diode element LD.

The switching thin film transistor Qs may include a control terminal (or a gate electrode), an input terminal (or a source/drain electrode), and an output terminal (or the drain/source electrode). The control terminal of the switching thin film transistor Qs may be connected to the scanning signal line 121, the input terminal thereof may be connected to the data line 171, and the output terminal may be connected to the driving thin film transistor Qd. The thin film switching transistor Qs may transmit data signals applied to the data line 171 to the thin film driving transistor Qd in response to a gate signal applied to the gate line 121.

The driving thin film transistor Qd also may include the control terminal (or the gate electrode), the input terminal (or the source/drain electrode), and the output terminal (or the drain/source electrode). The control terminal of the driving thin film transistor Qd may be connected to the switching thin film transistor Qs, the input terminal may be connected to the driving voltage line 172, and the output terminal may be connected to the light-emitting diode element LD. The thin film driving transistor Qd may flow a current ILD having a magnitude depending on the voltage between the control terminal and the output terminal thereof.

The storage capacitor Cst may be connected between the control terminal and the input terminal of the driving thin film transistor Qd. The storage capacitor Cst may charge the data voltage applied to the control terminal of the driving thin film transistor Qd and may maintain it, for example, after the switching thin film transistor Qs is turned off, thereby emitting the light-emitting diode element LD until a next data voltage is applied. The light-emitting diode element LD may have an anode connected to the output terminal of the driving thin film transistor Qd and a cathode connected to a ground voltage or a common voltage Vss. The light-emitting diode element LD may emit light having an intensity depending on the output current ILD of the driving transistor Qd in order to display images.

The switching thin film transistor Qs and the driving thin film transistor Qd may be a p-channel electric field effect transistor (FET). At least one of the switching thin film transistor Qs and the driving thin film transistor Qd may be an n-channel electric field effect transistor. A connection relationship of the thin film transistors Qs and Qd, the storage capacitor Cst, and the organic light emitting diode LD may be changed. An S-factor may be small, for example, to enable a fast driving speed in the switching thin film transistor Qs. The S-factor may be relatively large, for example, in the driving thin film transistor Qd to reduce a luminance deviation according to a gate voltage distribution. The term "S-factor" as a current-voltage characteristic of the thin film transistor may indicate a magnitude of the gate voltage required to increase the drain current by 10 times, for example, when a gate voltage of less than a threshold voltage is applied. The S-factor may be generally referred to as "a sub-threshold slope."

Figure 2:
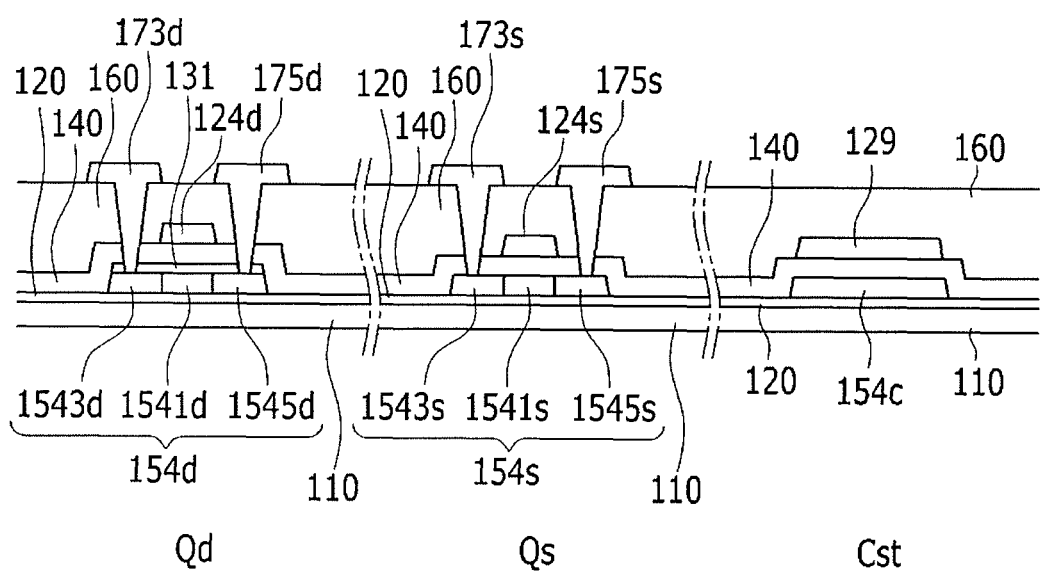
FIG. 2 illustrates a cross-sectional view showing a layer structure of a thin film transistor array panel.

A thin film transistor array panel and a manufacturing method thereof are provided FIG. 2 illustrates a cross-sectional view showing a layer structure of a thin film transistor array panel, and FIG. 3 to FIG. 10 illustrate cross-sectional views of stages of a manufacturing method of the thin film transistor array panel shown in FIG. 2, according to embodiment. Referring to FIG. 2, the thin film transistor array panel may include a driving thin film transistor Qd and a switching thin film transistor Qs formed on a substrate 110. The driving thin film transistor Qd and the switching thin film transistor Qs may be poly-Si thin film transistors. The thin film transistor array panel may include a storage capacitor Cst.

The driving thin film transistor Qd may include a semiconductor 154d, a gate electrode 124d, a source electrode 173d, and a drain electrode 175d. The driving thin film transistor Qd may be referred to as a top-gate thin film transistor as the gate electrode 124d may be formed on the semiconductor 154d. In other implementations, the driving thin film transistor may be, for example, a bottom-gate thin film transistor in which the gate electrode is formed under the semiconductor.

A gate insulating layer 140 may be between the semiconductor 154d and the gate electrode 124d, and an interlayer insulating layer 160 may be between the gate electrode 124d, and the source electrode 173d and drain electrode 175d. An oxide layer 131 may also be between the semiconductor 154d and the gate insulating layer 140. The oxide layer 131 may be directly on the semiconductor 154d. The oxide layer 131 may have a thickness of about 50 Å to about 400 Å. The oxide layer 131 may be a multilayer, and the multilayer may include at least one nitride layer and/or oxynitride layer.

The semiconductor 154d may include a source region 1543d and a drain region 1545d in which an impurity is doped on both edges. The source region 1543d and the drain region 1545d may be respectively and electrically connected to the source electrode 173d and the drain electrode 175d through a contact hole passing through the oxide layer 131 as well as the interlayer insulating layer 160 and the gate insulating layer 140. A blocking layer 120 may be between the substrate 110 and the semiconductor 154d. The switching thin film transistor Qs may include a semiconductor 154s, a gate electrode 124s, a source electrode 173s, and a drain electrode 175s.

Similar to the driving thin film transistor Qd, for example, the gate insulating layer 140 may be between the semiconductor 154s and the gate electrode 124s, and the interlayer insulating layer 160 may be between the gate electrode 124s, and the source electrode 173s and drain electrode 175s. In the switching thin film transistor Qs, the oxide layer may be omitted between the semiconductor 154s and the gate insulating layer 140. The gate insulating layer 140 may be directly on the semiconductor 154s. The semiconductor 154s may include a source region 1543s and a drain region 1545s in which an impurity is doped on both edges. The source region 1543s and the drain region 1545s may be respectively and electrically connected to the source electrode 173s and the drain electrode 175s through a contact hole passing through the interlayer insulating layer 160 and the gate insulating layer 140. The blocking layer 120 may be between the substrate 110 and the semiconductor 154s.

The storage capacitor Cst may include a first capacitor electrode 154c, for example, made of the semiconductor doped with the impurity and a second capacitor electrode 129 overlapping thereto, with the gate insulating layer 140 therebetween. The interlayer insulating layer 160 may be on the second capacitor electrode 129, and the blocking layer 120 may be between the substrate 110 and the first capacitor electrode 154c. In some implementations, the storage capacitor Cst may further include, for example, a third capacitor electrode overlapping the second capacitor electrode 129 via the interlayer insulating layer 160.

Figure 3:
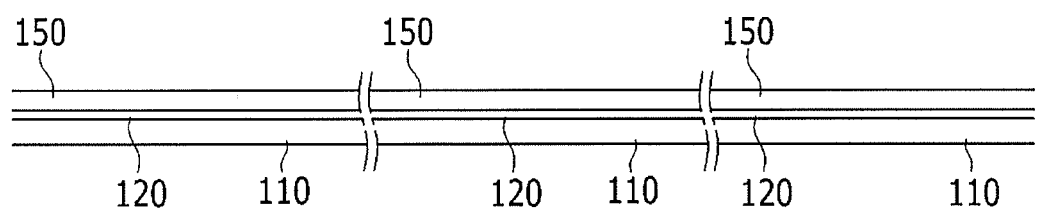
FIG. 3 to FIG. 10 illustrate cross-sectional views of stages of a manufacturing method of the thin film transistor array panel shown in FIG. 2.

Referring to FIG. 3 to FIG. 10, a thin film transistor array panel is described. FIG. 3 to FIG. 10 illustrate the cross-sectional views sequentially showing stages of a manufacturing process of the thin film transistor, according to an embodiment. Referring to FIG. 3, a blocking layer 120 may be formed on a substrate 110, and a polysilicon layer 150 may be formed thereon. The substrate 110 may be made of a transparent insulating material such as glass and plastic. For example, the substrate 110 may be formed of borosilicate-based glass having a heat-resistant temperature of 600° C. or more. The substrate 110 may be formed of plastic such as PET (polyethylene terephthalate), PEN (polyethylene naphthalate), and polyimide. The plastic substrate may be a flexible substrate.

The blocking layer 120, which may be referred to as a barrier layer or a buffer layer, may prevent diffusion of an impurity that may degrade a characteristic of the semiconductor and permeation of moisture or external air, and planarizes a surface. The blocking layer 120 may be formed of a single layer or a plurality of layers of $SiO_x$ and $SiN_x$ by a deposition method such as a PECVD (plasma enhanced chemical vapor deposition) method, an APCVD (atmospheric pressure CVD) method, as a LPCVD (low pressure CVD) method. The blocking 120 may be omitted based on the kind of the substrate or a process condition.

The polysilicon layer 150 may be formed, for example, by depositing amorphous silicon by a plasma CVD method, performing a dehydrogenation treatment where hydrogen included in the amorphous silicon may be removed, and forming a polysilicon state through laser crystallization such as excimer laser annealing. As a method for forming the polysilicon, a thermal crystallization method such as solid phase crystallization (SPC), super grain silicon (SGS) crystallization, induced crystallization (MIC), or metal induced lateral crystallization (MILC) may be used, as well as laser crystallization.

Figure 4:
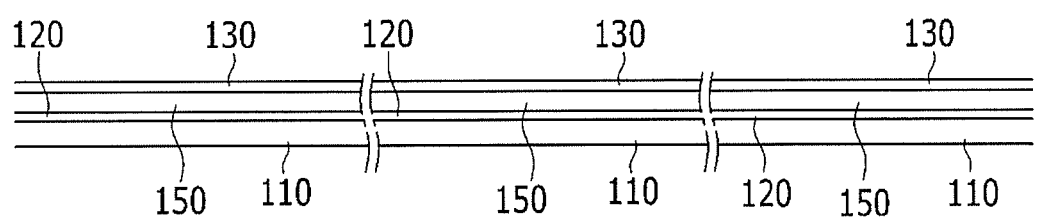

Referring to FIG. 4, an oxide layer 130 may be formed on the polysilicon layer 150. The oxide layer 130 may be formed as a single layer or as multiple layers by depositing $SiO_x$ through a deposition method such as PECVD, APCVD, or LPCVD. The oxide layer 130 may be formed, for example, with a thickness of about 50 Å to about 400 Å. The oxide layer 130 may include the layer made of $SiO_x$. In other implementations, the oxide layer 130 may include a layer(s) made of $SiN_x$ and/or $SiON_x$ as well as $SiO_x$ for the multi-layered structure.

For the formation of the described polysilicon layer 150, when applying the thermal crystallization as the method for the polysilicon, for example, the oxide layer 130 may be formed as a thermal oxide layer generated by controlling an oxygen atmosphere, for example, when performing the crystallization without a separate deposition process. After forming the oxide layer 130 on the amorphous silicon (a-Si), for example, the crystallization process for the formation of the described polysilicon layer 150 may be performed.

Figure 5:
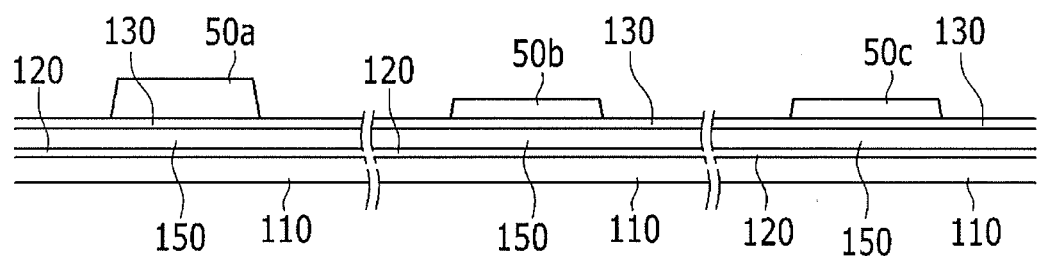

Referring to FIG. 5, a photosensitive film may be deposited on the oxide layer 130 and may be patterned through a photolithography process using a half-tone mask to form a first photosensitive film pattern 50a, a second photosensitive film pattern 50b, and a third photosensitive film pattern 50c. The first photosensitive film pattern 50a may be thicker than the second and the third photosensitive film patterns 50b and 50c. The second photosensitive film pattern 50b may have the same thickness as the third photosensitive film pattern 50c. The first photosensitive film pattern 50a may be formed at a position corresponding to the semiconductor 154d of the driving thin film transistor Qd, the second photosensitive film pattern 50b may be formed at a position corresponding to the semiconductor 154d of the switching thin film transistor Qs, and the third photosensitive film pattern 50c may be formed at a position corresponding to the first capacitor electrode 154c of the storage capacitor Cst.

Figure 6:
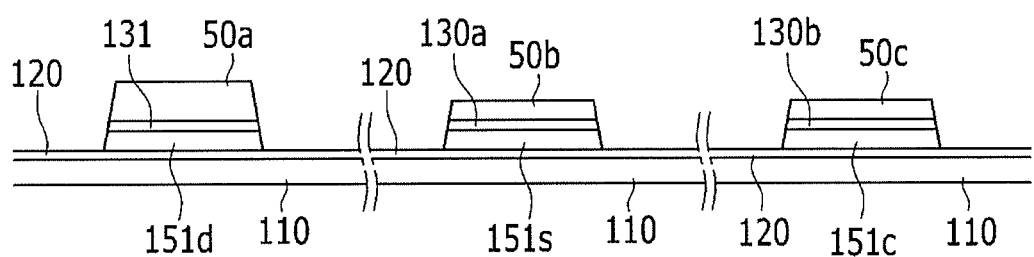

Referring to FIG. 6, by using the first, second, and third photosensitive film patterns 50a, 50b, and 50c as an etching mask, the oxide layer 130 and the polysilicon layer 150 may be sequentially etched to form a driving semiconductor 151d in which the semiconductor 154d of the driving thin film transistor Qd may be formed, a switching semiconductor 151s in which the semiconductor 154s of the switching thin film transistor Qs may be formed, and a capacitor semiconductor 151c in which a first capacitor electrode 154c of the storage capacitor Qst may be formed. The oxide layers 131, 130a, and 130b may be patterned the same as the semiconductors 151d, 151s, and 151c and may be formed thereon. For the etching, a dry etching or wet etching method may be used. However, in the case of the low temperature polysilicon, as pattern accuracy may be high, the dry etching may be mainly used.

Figure 7:
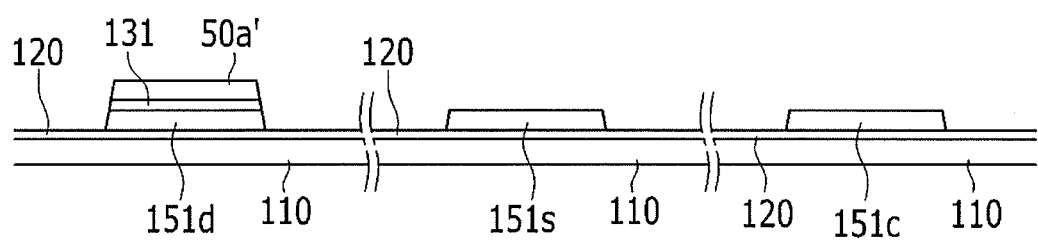

Referring to FIG. 7, the second and third photosensitive film patterns 50b and 50c may be removed by ashing, and a height of the first photosensitive film pattern 50a may be decreased thereby forming a fourth photosensitive film pattern 50a'. Next, by using the fourth photosensitive film pattern 50a' as the etching mask, the oxide layer 130a formed on the switching semiconductor 151s and the oxide layer 130b formed on the capacitor semiconductor 151c may be removed. Accordingly, the oxide layer 131 may be, for example, only formed on the driving semiconductor 151d. As a result, the characteristics of the driving thin film transistor Qd and the switching thin film transistor Qs may be different. For the etching, a dry etching or wet etching method may be used. For example, an etching process using a BOE (buffered oxide etchant) may be performed.

Figure 8:
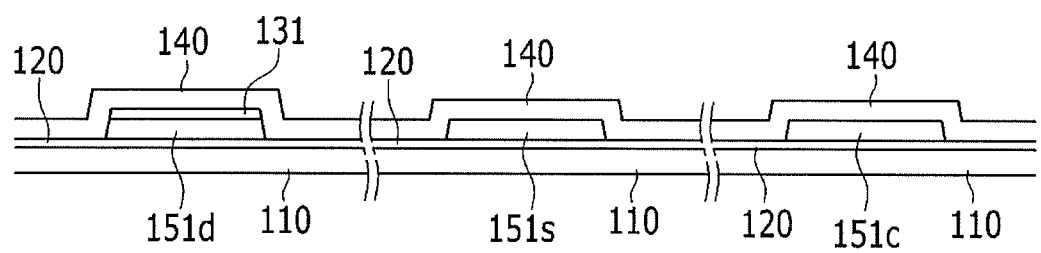

Referring to FIG. 8, after removing the fourth photosensitive film pattern 50a' by the ashing, a gate insulating layer 140 may be formed. The gate insulating layer 140 may be formed of an inorganic insulating material such as $SiO_x$, $SiN_x$, SiON, $Al_2O_3$, TiO, $Ta_2O_5$, $HfO_2$, $ZrO_2$, BST, or PZT by a deposition method such as a PECVD method, a LPCVD method, an APCVD method, or an ECR-CVD method. The gate insulating layer 140 may be formed of the signal layer or the multi-layered structure, and for example, the gate insulating layer 140 may include a layer made of $SiN_x$, $SiO_x$, and/or $SiON_x$.

Before forming the gate insulating layer 140, in the state that the oxide layer 130a formed on the switching semiconductor 151s and the oxide layer 130b formed on the capacitor semiconductor 151c are removed and the oxide layer 131 maintained on the driving semiconductor 151d, a plasma treatment may be performed. The plasma treatment may use $H_2$, $O_2$, $N_2O$, $N_2$, or a mixed gas including at least one of these. For an influence on the semiconductor layer according to the plasma treatment, the switching semiconductor 151s may be directly influenced. However, driving semiconductor 151d may be covered by the oxide layer 131 such that the driving semiconductor 151d may be less influenced. Accordingly, the characteristics of the driving thin film transistor Qd and the switching thin film transistor Qs may be different.

Figure 9:
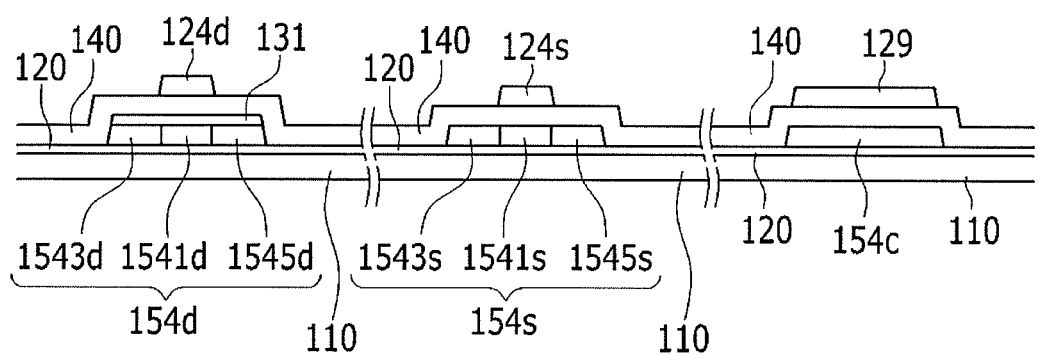

Referring to FIG. 9, on the gate insulating layer 140, a gate electrode 124d of the driving thin film transistor Qd, a gate electrode 124s of the switching thin film transistor Qs, and a second capacitor electrode 129 of the storage capacitor Cst may be formed. The gate electrodes 124d and 124s may be formed to overlap channel regions 1541d and 1541s of the semiconductors 154d and 154s. The second capacitor electrode 129 of the storage capacitor Cst may be formed to overlap the first capacitor electrode 154c. Also, through the impurity doping, source regions 1543d and 1543s and drain regions 1545d and 1545s of the semiconductors 154d and 154s of the driving and switching thin film transistors Qd and Qs and a first capacitor electrode 154c of the storage capacitor Cst may be formed. The capacitor semiconductor 151c that becomes the first capacitor electrode 154c of the storage capacitor Cst, for example, may be doped before forming the second capacitor electrode 129. The impurity may be a p-type impurity such as a boron (B) ion or an n-type impurity such as a phosphorus (P) ion. For example, the impurity may be the p-type impurity. An activation treatment may be used after impurity doping.

The gate electrodes 124d and 124s may include, for example, a conductive metal such as Al, Cu, Mo, W, Cr, or alloys thereof. Various conductive materials including a conductive polymer may be used as well as or as an alternative to the metal material. Also, the gate electrodes 124d and 124s may be formed of a transparent conductive material such as ITO (indium tin oxide), IZO (indium zinc oxide), and/or ZnO. The gate electrodes 124d and 124s may have a multilayer structure, for example a dual-layer structure. In this case, the lower layer may be made of a transparent conductive material and the upper layer may be made of a metal. The second capacitor electrode 129 of the storage capacitor may be formed of a transparent conductive material such as ITO, IZO, ZnO, the metal, and/or a conductive polymer.

When the gate electrodes 124d and 124s are formed as the dual layer including the transparent conductive material layer and the metal layer, and the second capacitor electrode 129 is formed of the transparent conductive material, for example, they may be formed by depositing the transparent conductive material and forming the metal layer by the deposition method such as a sputtering method and patterning the transparent conductive layer and the metal layer by a photolithography process using a half-tone mask and an etching process. The impurity doping to form the source regions 1543d and 1543s and the drain regions 1545d and 1545s of the semiconductors 154d and 154s of the driving and switching thin film transistors Qd and Qs and the first capacitor electrode 154c of the storage capacitor Cst may be performed, for example, after forming the gate electrodes 124d and 124s and the second capacitor electrode 129 by the patterning.

Figure 10:
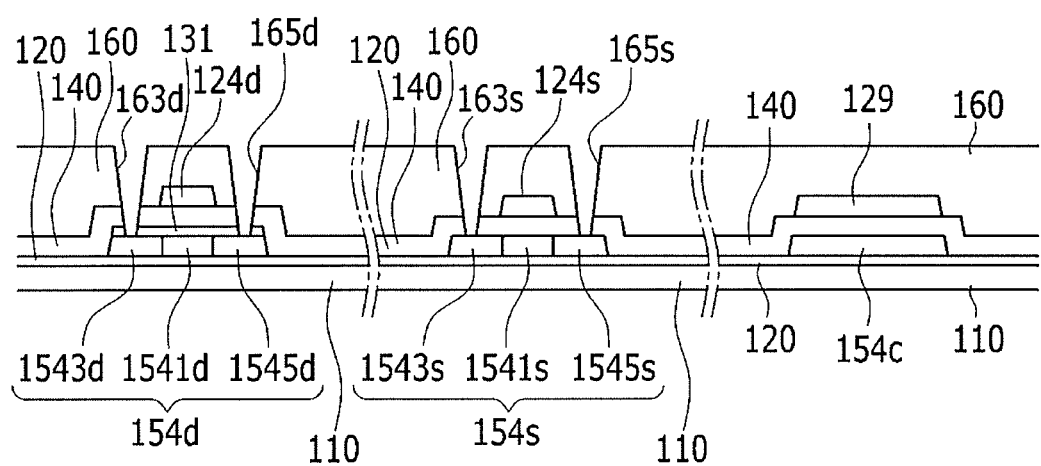

Referring to FIG. 10, an interlayer insulating layer 160 may be formed, and contact holes 163d, 165d, 163s, and 165s for the connection of the source electrodes 173d and 173s and the drain electrodes 175d and 175s of the driving and switching thin film transistors Qd and Qs may be formed by the photolithography process and the etching process. The interlayer insulating layer 160 may be an inorganic insulating layer formed of a material selected from $SiO_x$, $SiN_x$, $SiON_x$, $Al_2O_3$, TiO, $Ta_2O_5$, $HfO_2$, $ZrO_2$, BST, and PZT. The interlayer insulating layer 160 may be formed with a sufficient thickness to act as an insulating layer between the gate electrodes 124d and 124s, and the source electrodes 173d and 173s and the drain electrodes 175d and 175s. The interlayer insulating layer 160 may be an organic insulating layer as well as the inorganic insulating layer, or may have a structure in which both the organic insulating layer and the inorganic insulating layer may be deposited.

After forming the contact holes 163d, 165d, 163s, and 165s, a metal layer may be deposited by the deposition method such as the sputtering and patterned by the photolithography and an etching process to form the source electrodes 173d and 173s and the drain electrodes 175d and 175s. The source electrodes 173d and 173s and the drain electrodes 175d and 175s may be formed as a multi-layered structure, for example, Ti/Al/Ti. When forming the thin film transistor array panel, for example, the oxide layer 131 may only be formed on the semiconductor 154d of the driving thin film transistor Qd without the additional mask.

Figure 11:
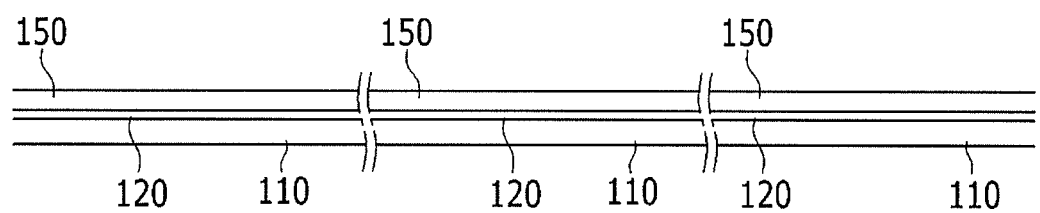
FIG. 11 to FIG. 14 illustrate cross-sectional views of stages of another manufacturing method of the thin film transistor array panel shown in FIG. 2.
Figure 12:
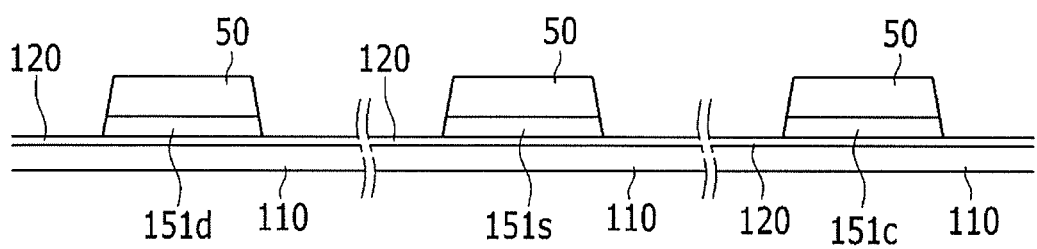

FIG. 11 to FIG. 14 illustrate cross-sectional views of stages of a manufacturing method of the thin film transistor array panel shown in FIG. 2, according to another embodiment. A mask may be, for example, only added to form the oxide layer 131 on the semiconductor 154d of the driving thin film transistor Qd. Referring to FIG. 11, a blocking layer 120 may be formed on a substrate 110, and a polysilicon layer 150 may be formed thereon through the crystallization of the amorphous silicon. Referring to FIG. 12, a photosensitive film may be deposited on the polysilicon layer 150 and may be patterned by the photolithography process to form a first photosensitive film pattern 50. The polysilicon layer 150 may be etched by using the first photosensitive film pattern 50 as the etching mask to form the driving semiconductor 151d that may become the semiconductor 154d of the driving thin film transistor Qd, the switching semiconductor 151s that may become the semiconductor 154s of the switching thin film transistor Qs, and the capacitor semiconductor 151c that may become the first capacitor electrode 154c of the storage capacitor Qst.

Figure 13:
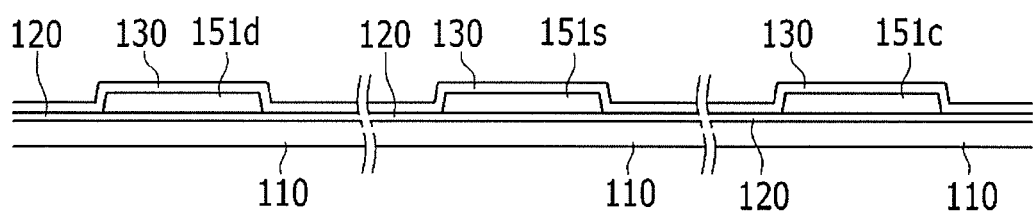
Figure 14:
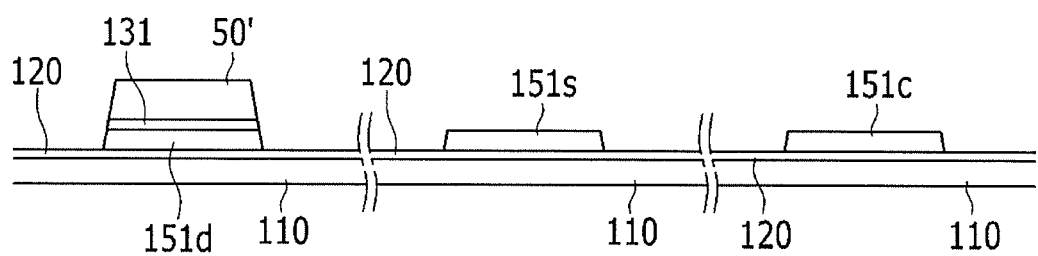

Referring to FIG. 13, the photosensitive film pattern 50 may be removed by the ashing, and the oxide layer 130 may be formed on the semiconductors 151d, 151s, and 151c. Referring to FIG. 14, a second photosensitive film pattern 50' may be formed at a position corresponding to the oxide layer 131 overlapping the semiconductor 151d of the driving thin film transistor Qd. The oxide layer 130 formed on the switching semiconductor 151s, and the capacitor semiconductor 151c may be removed through the etching process. Through this process, the oxide layer 131 may be, for example, only formed on the semiconductor 154d of the driving thin film transistor Qd. The following processes may be performed, for example, as described with respect to FIG. 8 to FIG. 10, and the plasma treatment may be performed, for example, before forming the gate insulating layer 140.

Figure 15:
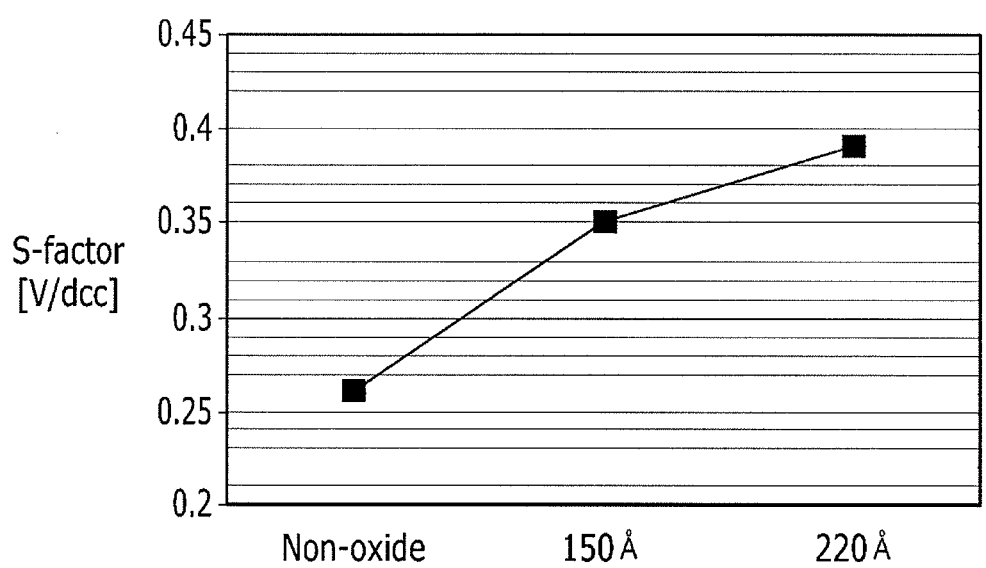
FIG. 15 illustrates a graph of a change of an S-factor according to a thickness of an oxide layer.

FIG. 15 illustrates a graph of a change of an S-factor according to a thickness of an oxide layer. The S-factor of the thin film transistor may be measured while the oxide layer is formed with various thicknesses between the semiconductor and the gate insulating layer of the thin film transistor. As shown, it may be confirmed that the S-factor may be increased as the thickness of the oxide layer is increased. When only the driving thin film transistor Qd has such an oxide layer, for example, the S-factor of the driving thin film transistor Qd may be increased while maintaining the S-factor of the switching thin film transistor Qs. Accordingly, a luminance change may be reduced while maintaining operation speed of the display device.

Figure 16:
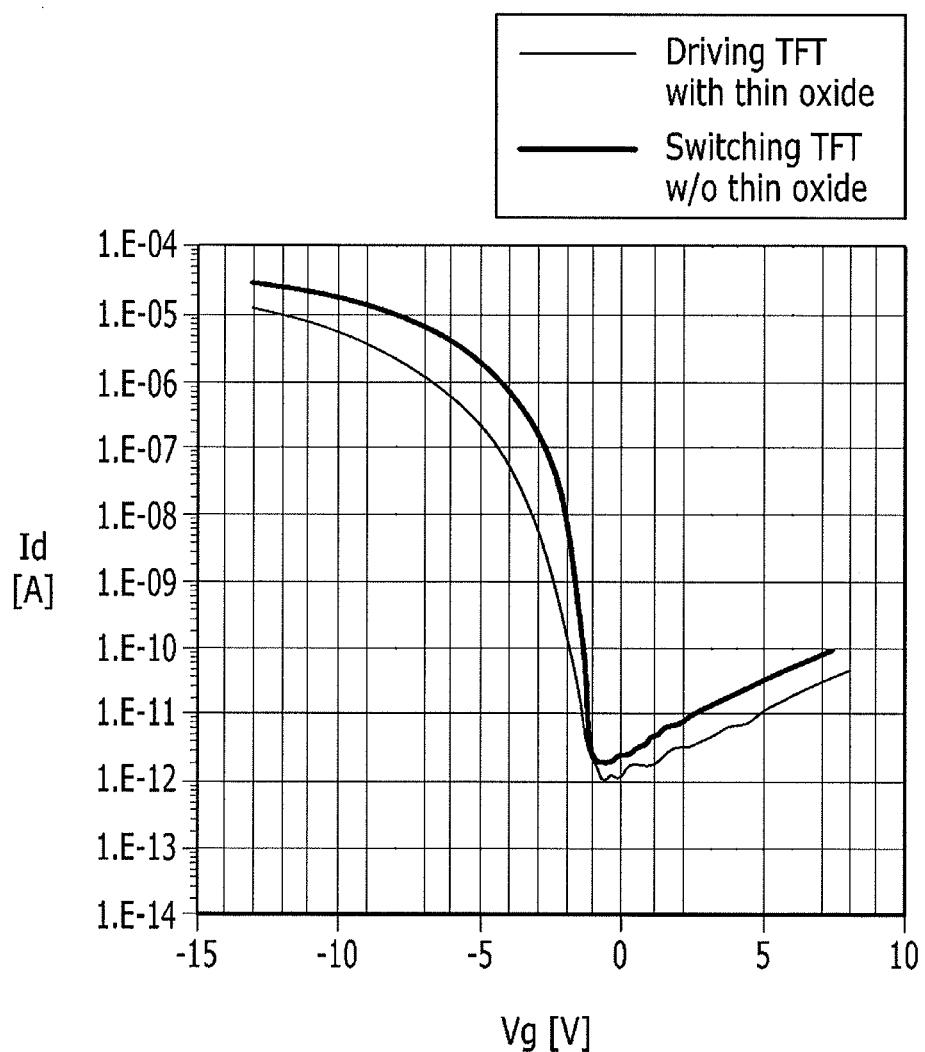
FIG. 16 illustrates a graph comparing a characteristic of a thin film transistor according to presence or absence of an oxide layer.

FIG. 16 illustrates a graph comparing a characteristic of a thin film transistor according to presence or absence of an oxide layer. After manufacturing the thin film transistor array panel in which the oxide layer is formed in the driving thin film transistor Qd and the oxide layer is not formed in the switching thin film transistor Qs, for example, a current-voltage characteristic of each thin film transistor may be measured. As shown, the S-factor of the switching thin film transistor Qs may be relatively small, but the S-factor of the driving thin film transistor Qd may be relatively large. Accordingly, two kind thin film transistors having different S-factors may be formed in one thin film transistor array panel.

Figure 17:
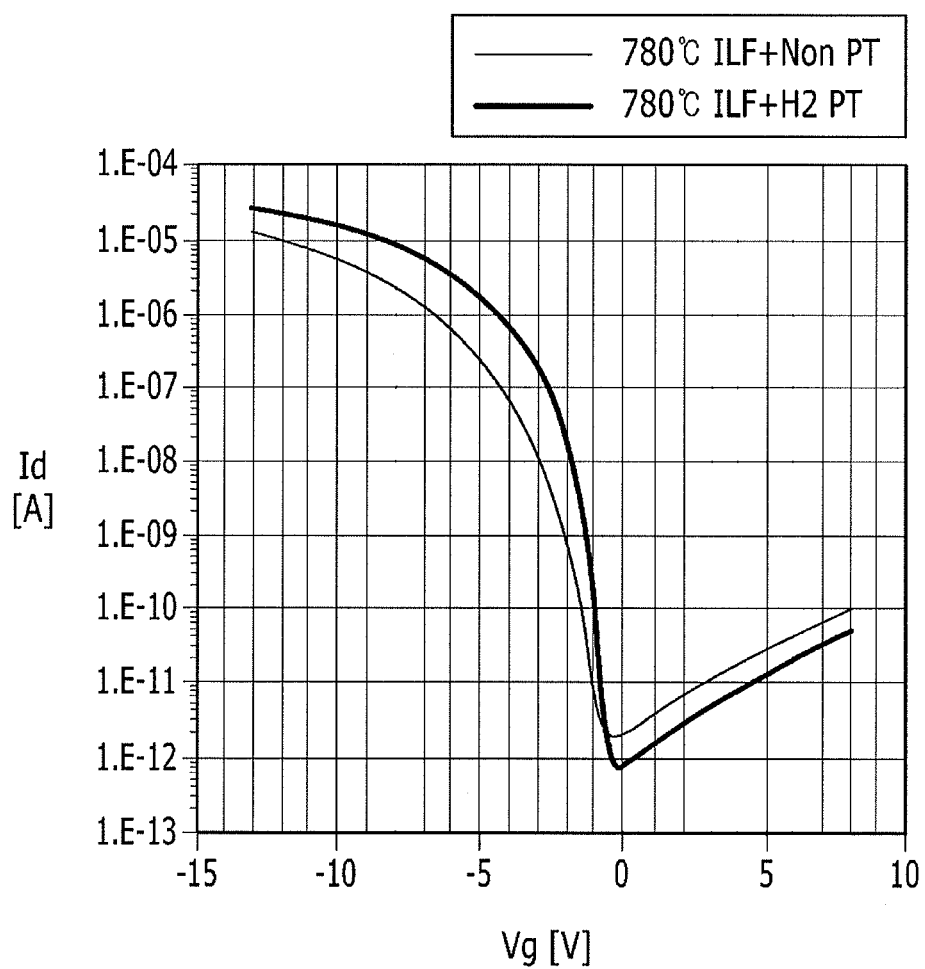
FIG. 17 illustrates a graph comparing a characteristic of a thin film transistor according to presence or absence of a plasma process.

FIG. 17 illustrates a graph comparing a characteristic of a thin film transistor according to presence or absence of a plasma process. If the plasma treatment is performed to the semiconductor layer of the thin film transistor, as shown in the drawing, for example, an on-current may be increased such that the S-factor may be decreased. When the oxide layer is formed on the semiconductor layer of the driving thin film transistor Qd but the oxide layer is not formed on the semiconductor layer of the switching thin film transistor Qs, for example, when performing the plasma treatment, the semiconductor layer of the switching thin film transistor Qs may be exposed as it is to the plasma, however the semiconductor layer of the driving thin film transistor Qd is not exposed due to the oxide layer. Accordingly, the S-factor of the switching thin film transistor Qs may be selectively reduced while manufacturing the thin film transistor array panel.

By way of summation and review, the S-factor of the switching thin film transistor may be maintained or reduced, and the S-factor of the driving thin film transistor may be increased. Accordingly, the luminance deviation may be reduced while maintaining the operational speed of the organic light emitting diode display.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A thin film transistor array panel, comprising a substrate and
 a plurality of pixels on the substrate, each pixel including:
  a driving thin film transistor including
   a first semiconductor including a first source region and a first drain region,
   a first gate electrode overlapping the first semiconductor,
   a gate insulating layer between the first semiconductor and the first gate electrode,
   an oxide layer between the first semiconductor and the gate insulating layer,
   a first source electrode, and
   a first drain electrode; and
  a switching thin film transistor including
   a second semiconductor including a second source region and a second drain region,
   a second gate electrode overlapping the second semiconductor,
   the gate insulating layer between the second semiconductor and the second gate electrode and contacting an upper portion of the second semiconductor,
   a second source electrode, and
   a second drain electrode,
  wherein the driving thin film transistor has a larger S-factor than a S-factor of the switching thin film transistor.

2. The thin film transistor array panel as claimed in claim 1, wherein the oxide layer has a thickness of about 50 Å to about 400 Å.

3. The thin film transistor array panel as claimed in claim 1, wherein the oxide layer is a multilayer including a nitride layer and/or an oxynitride layer.

4. The thin film transistor array panel as claimed in claim 1, wherein the switching thin film transistor does not include an oxide layer between the second semiconductor and the gate insulating layer.

5. The thin film transistor array panel as claimed in claim 1, wherein the pixel further includes a storage capacitor including a first electrode and a second electrode overlapping each other, the gate insulating layer being between the first electrode and the second electrode.

6. A method of manufacturing a thin film transistor array panel, the method comprising:
  forming an amorphous silicon layer on a substrate;
  crystallizing the amorphous silicon layer to form a polysilicon layer;
  forming an oxide layer on the polysilicon layer;
  patterning the polysilicon layer and the oxide layer to form a first semiconductor with the oxide layer thereon and a second semiconductor with the oxide layer thereon;
  removing the oxide layer on the second semiconductor while retaining the oxide layer on the first semiconductor;
  forming a gate insulating layer on the second semiconductor and the oxide layer on the first semiconductor; and
  forming gate electrodes on the gate insulating layer, the gate electrodes respectively overlapping the first semiconductor and the second semiconductor.

7. The method as claimed in claim 6, wherein the oxide layer has a thickness of about 50 Å to about 400 Å.

8. The method as claimed in claim 6, wherein the forming of the oxide layer includes depositing SiOx.

9. The method as claimed in claim 6, wherein the crystallizing includes thermally crystallizing the amorphous silicon layer and controlling an oxygen atmosphere to generate a thermal oxide layer as part of the oxide layer.

10. The method as claimed in claim 6, wherein forming the first and second semiconductors and removing the oxide layer are performed by photolithography processes and etching processes using one mask.

11. The method as claimed in claim 6, further comprising performing a plasma treatment before forming the gate insulating layer.

12. The method as claimed in claim 11, wherein the plasma treatment is performed by using $H_2$, $O_2$, $N_2O$, $N_2$, or a mixed gas including at least one of $H_2$, $O_2$, $N_2O$, and $N_2$.

13. The method as claimed in claim 6, wherein patterning includes
  forming a third semiconductor as a first electrode of a storage capacitor; and
  forming the gate electrodes includes forming a second electrode of the storage capacitor overlapping the third semiconductor of the first electrode, the gate insulating layer being between the first electrode and the second electrode.

14. The method as claimed in claim 13, further comprising doping the first semiconductor, the second semiconductor, and the third semiconductor with an impurity to form a source region and a drain region of a first thin film transistor, a source region and a drain region of a second thin film transistor, and the first electrode of the storage capacitor, respectively.

15. The method as claimed in claim 6, wherein formation of the polysilicon layer is performed after forming the oxide layer.

16. A method of manufacturing a thin film transistor array panel, the method comprising:
  forming an amorphous silicon layer on a substrate;
  crystallizing the amorphous silicon layer to form a polysilicon layer;
  patterning the polysilicon layer to form a first semiconductor and a second semiconductor;
  forming an oxide layer on the first semiconductor and the second semiconductor;
  patterning the oxide layer to remove the oxide layer except for the oxide layer on the first semiconductor;
  forming a gate insulating layer on the second semiconductor and the oxide layer on the first semiconductor; and
  forming gate electrodes on the gate insulating layer, the gate electrodes respectively overlapping the first semiconductor and the second semiconductor.

17. The method as claimed in claim 16, further comprising performing a plasma treatment before forming the gate insulating layer.

18. The method as claimed in claim 17, wherein patterning the polysilicon layer includes forming a third semiconductor for a first electrode of a storage capacitor, and forming the gate electrodes includes forming a second electrode of the storage capacitor overlapping the third semiconductor, the gate insulating layer being between the first electrode and the second electrode.

19. The method as claimed in claim 18, further comprising doping the first semiconductor, the second semiconductor, and the third semiconductor with an impurity to form a source region and a drain region of a first thin film transistor, a source region and a drain region of the second thin film transistor, and the first electrode of the storage capacitor, respectively.

* * * * *